United States Patent [19]

Candy

[11] 3,893,102

[45] July 1, 1975

[54] DIGITAL-TO-ANALOG CONVERTER USING DIFFERENTLY DECODED BIT GROUPS

[75] Inventor: James Charles Candy, Convent Station, N.J.

[73] Assignee: Bell Telephone Laboratories, Incorporated, Murray Hill, N.J.

[22] Filed: Nov. 2, 1973

[21] Appl. No.: 412,296

[52] U.S. Cl. .......... 340/347 DA
[51] Int. Cl.² .......... H03K 13/02
[58] Field of Search .......... 340/347 DA; 235/197; 328/14

[56] References Cited

UNITED STATES PATENTS

| | | | |
|---|---|---|---|
| 2,932,017 | 4/1960 | Prince | 340/347 DA |
| 3,132,334 | 5/1964 | Williams | 340/347 DA |
| 3,235,862 | 2/1966 | Fiorini | 330/51 UX |
| 3,305,857 | 2/1967 | Barber | 340/347 DA |
| 3,454,943 | 7/1969 | Brown | 340/347 DA |
| 3,555,540 | 1/1971 | Hartke | 340/347 DA |
| 3,576,575 | 4/1971 | Hellwarth et al. | 340/347 DA |
| 3,579,232 | 5/1971 | Girard et al. | 340/347 DA |
| 3,668,693 | 6/1972 | Eaton et al. | 340/347 SY |
| 3,754,233 | 8/1973 | Sutherland | 340/347 DA |
| 3,789,393 | 1/1974 | Tripp | 340/347 DA |

OTHER PUBLICATIONS

French, "Digital-Analog Converter," IBM Technical Disclosure Bulletin, 1959, p. 135, 136.

Millman & Taub, "Pulse, Digital and Switching Waveforms," McGraw-Hill, 1965, p. 345-347.

Landee et al., "Electronic Designers' Handbook," McGraw-Hill Book Co., 1957, p. 12-18, 12-19.

Seely, "Electron-Tube Circuits," McGraw-Hill Book Co., 1950, p. 276, 277.

*Primary Examiner*—Thomas J. Sloyan
*Attorney, Agent, or Firm*—C. S. Phelan

[57] ABSTRACT

Digital signals are split into at least two bit groups of different binary significance. The first and most significant of the bit groups is registered and periodically sampled for conversion in a resistor network to an analog format. Bits of the second, or least significant, bit group are incremented at a rate equal to the sampling rate; and incrementing overflow is detected and used to increase the output of the most significant bit group register by an amplitude corresponding to one quantizing interval of the most significant bit group. The analog output of the resistor network is averaged and corresponds closely to the value of the digital input. Embodiments for decoding both linear and segmented pulse codes are shown.

18 Claims, 5 Drawing Figures

DIGITAL-TO-ANALOG CONVERTER USING DIFFERENTLY DECODED BIT GROUPS

BACKGROUND OF THE INVENTION

1. Field of the Invention

This invention relates to digital-to-analog converters and, in particular, to such converters for producing a so-called baseband analog signal.

2. Description of the Prior Art

Converters which produce a baseband analog signal are those in which input signal information represents digitally the evenly spaced instantaneous amplitudes of the signal. The digital code may include an indication of the polarity of the signal. The output of such a converter is passed through a low-pass filter which cuts off at a frequency that is no more than half of the sampling rate. These converters are to be distinguished from those which produce a discrete analog output in which, e.g., telemetered information is represented by the amplitudes of a sequence of pulses which are not low-pass filtered.

One relatively simple digital-to-analog converter includes some form of digital buffer register and a resistor network for simultaneously coupling outputs of different register stages through a common circuit node to an output connection. Such a resistor network usually includes one input connection, or tap for each binary order. In which case, the accuracy of the output is in large measure a function of the ratios among the resistances of the weighted resistance resistors of various sizes employed in the resistor network. Great resistance precision is required, and in the usual prior art converter precision to better than one part in a hundred in the resistor values is required. It is, therefore, not unusual in digital-to-analog converters to employ differently weighted resistors which must be in the plus or minus 0.1-percent tolerance category. If instead of using a weighted resistor tap for every binary order, one resistor tap were provided for every output level, then the converter would have greater tolerance leeway on resistance values; but the converter also would require inconveniently large numbers of wires and resistors as the need for greater amplitude level resolution increases.

Apart from questions of numbers of resistors and resistance tolerances, digital-to-analog converters involve noise considerations. When binary weighted resistor taps are used there is a significant amount of output analog signal noise due to transients arising from the variable reactances associated with the circuits. The analog output signal may include large signal discontinuities that cannot be smoothed out because they include frequency components in the desired baseband spectrum. Smoothing thus requires a fairly costly resampling of the analog signal prior to filtering. When a signal resistor tap is associated with each output level, the transients are smaller and can be identical for each level; and the signal distortions due to such transients are more tolerable than those in binary networks. There are, of course, counting type digital-to-analog converters in the art. However, they are primarily useful for only instrumentation because the counting function usually cannot be carried out fast enough to cover the large amplitude ranges required, for example, for voice signal transmission or the high information rates required for video signal transmission.

STATEMENT OF THE INVENTION

The foregoing difficulties of the prior art converters are reduced in an embodiment of the present invention in which each multibit character of a digital signal is divided into at least two bit groups. A first such group is decoded in a resistor network to obtain a corresponding analog signal. The second bit group is utilized to determine a time within a digital sample period at which that analog signal is to be supplemented by an amplitude corresponding to a quantizing interval magnitude of the first bit group.

In an illustrative embodiment, the first bit group is a group of the most significant bits and the second group is a group of the least significant bits. The latter group is incremented to full count status during the character time and a signal produced on attainment of full count is utilized to increment the most significant bit group.

It is a feature of the invention that the number of bits, and hence also the number of levels associated with the first group, is relatively small and thus relatively low precision resistances are adequate. Moreover, it is feasible to provide one resistance tap for each output level, thus improving the tolerance requirements and reducing transients. This circuit can easily be constructed using integrated circuit techniques.

It is another feature that the fine details of the analog signal are provided by controlling a pulse width. This can be accomplishhed with more precision than can be realized in the control of voltage amplitudes.

A further feature is that the invention reduces digital-to-analog converter cost to a point where the invention makes such a converter a serious candidate for a per-channel decoder in a multichannel communication system.

Still another feature of the invention is that a relatively small counting range is required to achieve a comparatively high degree of resolution so that a converter, in accordance with the invention, can operate sufficiently rapidly for video signal work.

BRIEF DESCRIPTION OF THE DRAWINGS

A more complete understanding of the invention and its various features, objects, and advantages may be obtained from a consideration of the following detailed description and the appended claims in connection with the attached drawings in which:

DETAILED DESCRIPTION

Figure 1:
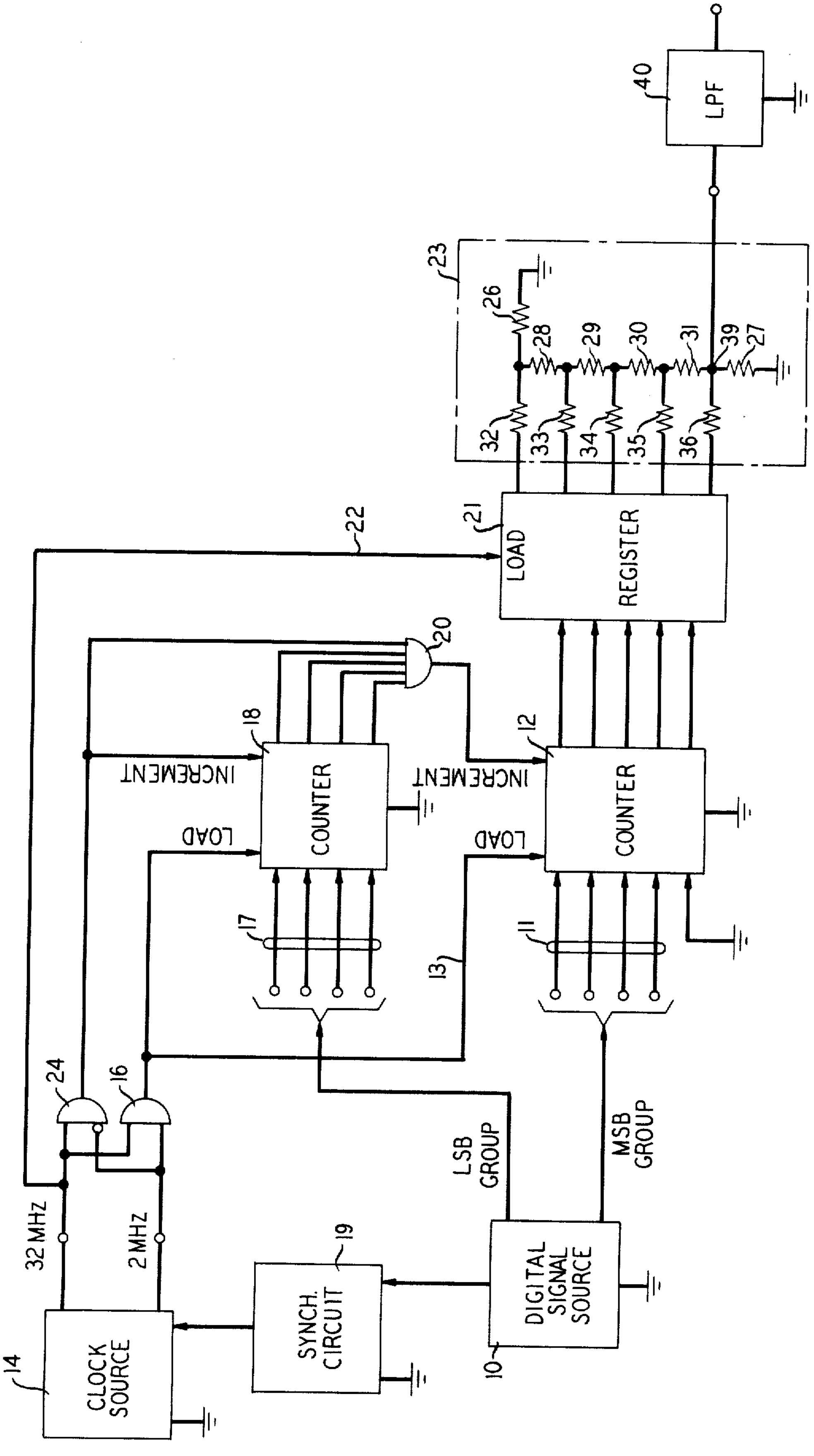
FIG. 1 is a simplifed schematic diagram of a digital-to-analog converter in accordance with the present invention.

In FIG. 1 a digital signal source 10 supplies pulse coded characters. Each character is provided in bit-parallel format, and it is assumed for the present that a conventional linear binary coding representation is employed for unipolar analog signals. The digital characters supplied by source 10 are provided at a frist rate which is herein designated the character, or sample, rate; and each character is for convenience of description assumed to include eight binary digits, or bits. Thus, each character is capable of designating any one of 256 different analog signal levels.

A first group of the bits of each character includes the four most significant bits and is coupled by way of a 4-circuit signal path 11 to inputs of corresponding respective stages of buffer storage wherein the information of the bit group is registered. In the illustrative embodiment, such storage is provided by a binary counter 12 and the bits are entered under the control of a loading pulse applied on a lead 13 to the counter 12 from a clock signal source 14 by way of a coincidence gate 16. Those bits are entered with the most significant bit in the next to the lowermost (as illustrated in FIG. 1) stage of the counter, and other bits are entered in their respective order positions behind the most significant bit in corresponding stages of the counter. Although the most significant bit group (MSB) includes only four bits in the illustrative embodiment, couner 12 includes an extra, or 5th, stage in the lowermost, most significant, position for a reason which will subsequently become apparent. This lowest stage has a grounded input so it is initially reset to ZERO by the load pulse from lead 13.

A second group of bits of each character from the digital signal source 10 is similarly applied by way of a multicircuit path 17 for registration in respective stages of buffer storage which is schematically represented in the drawing by a counter 18. This registration takes place at the same time and in response to the same pulse as hereinbefore described in conection with the counter 12.

The clock source 14 is synchronized with the digital signal source 10 by any suitable arrangement, as schematically represented by a synchronizing circuit 19 interconnecting those two sources. Typically, digital signal timing is advantageously recovered from incoming digital signals and utilized for synchronizing the clock source 14. A first synchronized clock output is provided at the character rate for the incoming digital signals and is advantageously indicated in the drawing as a 2-MHz output which is applied to one input of the conicidence gate 16. A second synchronized output of the source 14 is indicated in the drawing as a 32-MHz output, and it is utilized for enabling actuation of the gate 16 and enabling the loading of counter 12 contents into a register 21, which will be further hereinafter discussed. In addition, the 32-Mhz output is coupled through a coincidence gate 24, when not inhibited by a 2-MHz clock pulse, for incrementing counter 18 and enabling a further coincidence gate 20.

Counters 12 and 18 and the register 21 may be of any convenient type that can be loaded through a gated bit-parallel input, as hereinbefore described, for overwriting any prior contents of the counter or register involved. If counters are used that include logic to prevent incrementing during loading, gate 24 can be eliminated. The counters must also be capable of counting at frequencies which are suitable for the operations herein described, as well as operating, of course, in accordance with the same coding rule utilized in the pulse coded digital characters provided by source 10. For example, the second synchronized output of clock source 14, the 32-MHz output shown in FIG. 1, must be of a sufficiently high frequency to allow the counter 18 to count from the all-ZERO state to the full count for overflow state for the number of bits in the least significant bit group within one character time of the signal from source 10. The register 21, in addition to having gated bit-parallel input in response to clock pulses on lead 22, must also provide continuous bit-parallel outputs to a resistor network 23.

Resistor network 23 receives binary coded input signal characters and produces an analog output with amplitudes that can vary over a corresponding linear range. The network includes a potential divider made up of plural series-connected resistors, and both ends of the divider are connected to ground. Resistances of the network are selected to produce output analog signal levels that can be represented by the most significant bit group of the total characters supplied by source 10. The resistors 26 and 27 at either end of the potential divider advantageously have resistance values that are the same and that are twice the resistance values of each of the four intermediate resistors 28, 29, 30, and 31. For example, resistors 26 and 27 are advantageously 1000-ohm resistors and the resistors 28 through 31 are advantageously 500-ohm resistors. Five additional resistors 32 through 36 each have a resistance equal to that of either of the resistors 26 or 27 and are coupled between the output of a different stage of register 21 and a different terminal of one of the four intermediate divider resistors 28 through 31. Each of the aforementioned tap resistors 32 through 36 must be connected to its respective stage so that a binary signal input of a predetermined type on any of the stages will produce a corresponding output for that stage which is of the same type for all stages. Since relatively few currents flow in a relatively small number of resistors for an eight-bit character from source 10, resistors employed in the network 23 are advantageously of the plus or minus 1-percent resistance tolerance class.

The output of the resistance network 23 is derived at a terminal 39 to which the tap resistor of the most significant stage of register 21 is also connected. That resistor network output is applied to a low-pass filter 40 which has a cutoff frequency no more than half the character rate for signals provided from source 10. The filter 40 is intended to provide smoothing of amplitude steps in the analog signal waveform resulting from the digital type of sampling accomplished in the periodic loading of register 21.

Figure 2:
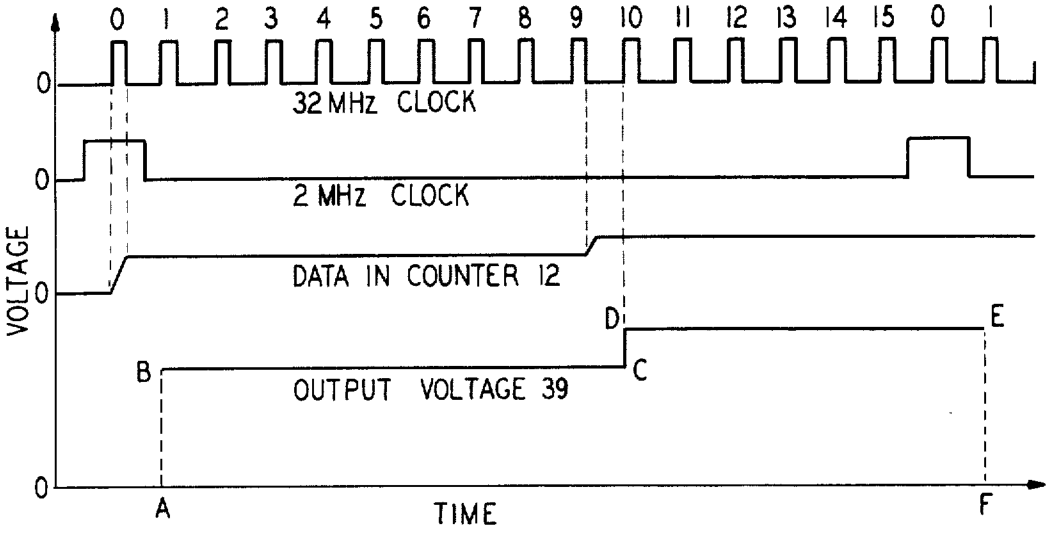
FIG. 2 is a timing diagram for facilitating an understanding of the operation of the converter of FIG. 1.

FIG. 2 includes a family of voltage-versus-time diagrams illustrating the operation of the digital-to-analog converter of FIG. 1. Each 2-MHz clock pulse brackets, in time, a single 32-MHz clock pulse; and on coincidence of the pulses, gate 16 in FIG. 1 is actuated to provide a loading pulse to counters 12 and 18. During each 32-MHz clock pulse, register 21 is enabled to sample the content of counter 12. However, the new information to the register 21 at the time of actuation of gate 16 is the information from the final period of the preceding character time. Since loading is accomplished on the leading edge of a clock pulse, register 21 is able to sample the old information before the new bits are stabilized in counter 12. The succeeding 32-MHz pulse, i.e., pulse number 1 in FIG. 2, loads the new most significant bit group from counter 12 into register 21. That information is immediately decoded in resistor network 23 to appear as the output voltage amplitude BC at the input to low-pass filter 40.

Counter 18 is also incremented on that 32-MHz clock pulse number 1 and on each subsequent pulse of the same clock pulse train. Upon the attainment of the predetermined count level in the counter 18, i.e., the full condition (1111) in the illustrative embodiment, the counter combined outputs enable coincidence gate 20 to be actuated by the next (incrementing occurs on the trailing edge of a clock pulse) 32-MHz clock pulse. Gate 20 thus provides an output pulse for increasing the analog signal output. In the embodiment of FIG. 1, that increase is achieved by using the gate 20 output pulse to increment counter 12. The latter counter is provided with an extra stage, as hereinbefore mentioned, in order to allow for the eventuality that the most significant bit group from source 10 may initially comprise all binary ONES. In that event the incrementing pulse from gate 20 does not reset the counter and thereby create an ambiguity in the input to register 21; instead the counter 12 is advanced to the 10000 state.

As indicated in the symbolic voltage diagram for DATA IN COUNTER 12 in FIG. 2, the incrementing of counter 12 occurs in response to the pulse number 9 in the 32-MHz clock pulse train. That diagram is called symbolic because it represents illustrative count levels rather than true voltages. Thus, in the illustrated counter content sequence, the content was zero prior to the initial pulse number 0 in the 32-MHz train, the counter 12 was loaded with some positive value during that pulse, and the counter 12 was incremented during clock pulse number 9.

In order to produce the aforementioned incrementing on pluse number 9, the initial value of the least significant bit group in counter 18 must have been seven so that an additional nine clock pulses caused counter 18 to overflow. Upon the occurrence of the tenth 32-MHz clock pulse, the incremented value of the most significant bit group is sampled into register 21 thereby causing an increase in the analog signal output by an amount equal to the least significant bit quantizing interval of counter 12. This increases the analog output to the level DE in FIG. 2.

It should thus be apparent that the time at which the analog signal output is supplemented is determined by the value of the least significant bit group applied to counter 18 at the beginning of a character time. When that analog signal is averaged over a full character time by the low-pass filter 40, the resulting average analog amplitude corresponds to the total digital input character value. This result is achieved with a maximum of only a 4-bit counting range in counter 18 and only a 5-tap resistor network for attaining a degree of resolution corresponding to an 8-bit digital input, i.e., a digital input defining any one of 256 analog signal levels. Furthermore, only two different resistor values are required for the network 23.

A circuit designer must determine his own comprise for the numbers of bits to be included in the groups handled by counters 12 and 18. If fewer bits are included in the most significant bit group, fewer basic analog levels can be defined, the wiring and resistance manufacturing jobs for the network 23 are easier, but more bits will then fall into the least significant bit group so that the 32-MHz clock must be changed to a substantially higher rate in order to be able to count through the full range represented by those least significant bits during one character time.

Since the embodiment of FIG. 1 has been described in terms of operations spanning a full character time, it is in that mode a per-channel decoder. That is, one converter must be provided for each information signal channel. This arrangement has advantages in terms of reduced crosstalk among channels. However, if crosstalk is not a serious problem and if higher clock rates can be accommodated for a particular application, the converter of FIG. 1 can be time shared among plural channels. The benefits of such time sharing are a reduction in converter equipment cost because fewer converters are required and a possible reduction in signal-to-noise ratio at the output of filter 40 for any given channel. This reduction would result from the reduction in duration of each character time with the same 2-step type of analog signal. Thus, the noise resulting from such steps is forced into a higher frequency range and can be more readily eliminated by the filter 40.

Figure 3:
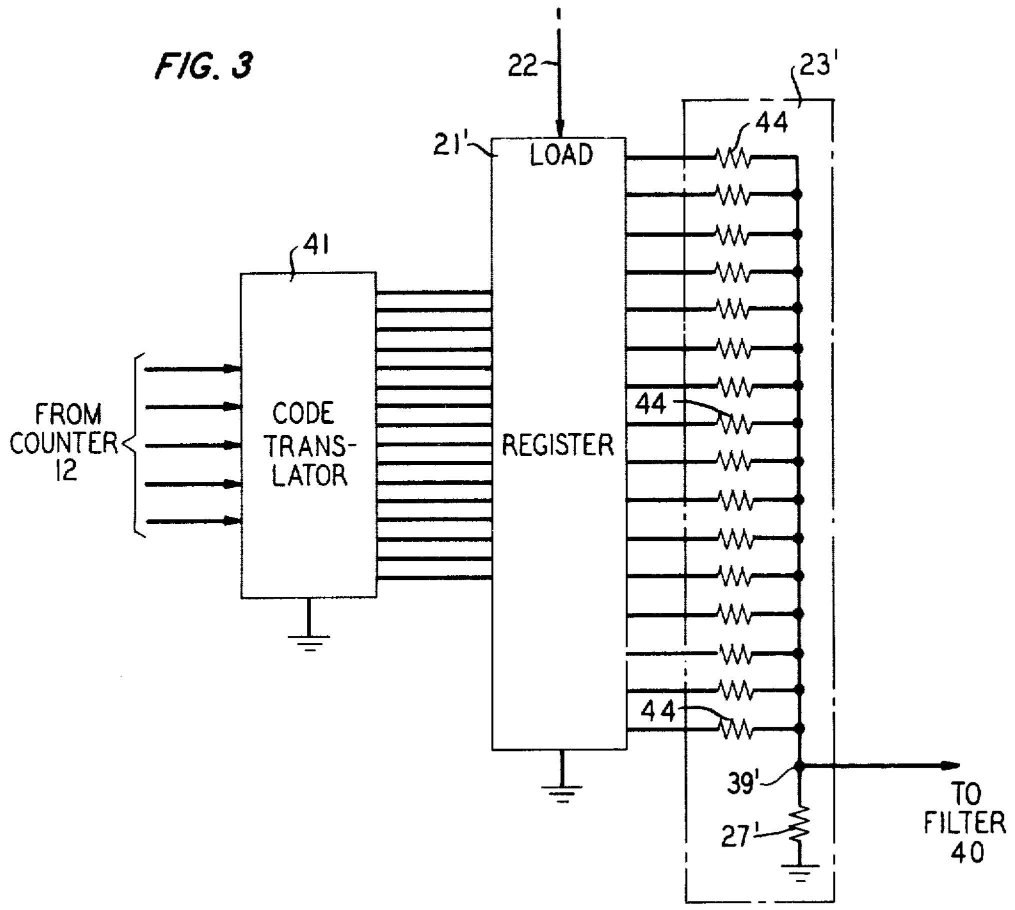
FIG. 3 is a partial schematic diagram illustrating a modification of the converter of FIG. 1.

The partial schematic diagram of FIG. 3 illustrates a modified arrangement for coupling the output of counter 12 to the decoding resistor network for producing the desired analog signal output. In FIG. 3, one resistor tap is used for each output level. This arrangement is somewhat more complex than that which was described in connection with FIG. 1, but it provides an analog output which is very tolerant of imprecisions and has reduced signal overshoot transients in accomplishing transitions between analog signal levels. Reference characters employed in FIG. 3 are the same as or similar to those employed in FIG. 1 for corresponding circuit elements.

The 5-bit output from counter 12 in FIG. 1 is coupled by a code translator 41 of FIG. 3 to the respective stage inputs of the register 21'. Translator 41 is advantageously adapted for converting binary coded inputs into n-out-of-m outputs in such a way as to cause the translation of an input binary coded number N into an output code in which the N uppermost (as shown in FIG. 3) output leads of translator 41 are energized and the remaining leads are not energized. Thus, the translator produces energization of the N least significant outputs of the translator. Assuming that the binary input to translator 41 can represent *m* discrete analog signal levels, the 5-bit input shown means seventeen possible levels for the illustrative embodiment where the counter 12 receives a 4-bit most significant bit group from source 10 and can be incremented by one additional step during a character time. Since the all-ZERO output of counter 12 indicates simply that there should be no output from register 21' to the resistor network 23', the translator 41 can disregard that binary signal condition and provide only 16 outputs to the register 21'. One schematic illustration of an embodiment of such a translator for converting five input binary bits into 16 output bits will subsequently be discussed in connection with FIG. 4.

Register 21' is of the same type as hereinbefore described for the register 21 in FIG. 1, but includes sixteen stages instead of the five represented in FIG. 1. Resistor network 23' is modified from the network illustrated in FIG. 1 and includes sixteen resistors 44 that are all of the same resistance, e.g., 10 kilohms, connected from the respective outputs of the register 21' stages to the common output terminal 39'Network 23' receives n-out-of-m coded input characters and produces an analog output with amplitudes that can vary over a corresponding linear range. In this embodiment the load resistor 27' connected between terminal 39' and ground is approximately two orders of magnitude smaller than any of the resistors 44 and thus advantageously is assigned a resistance of about 100 ohms. Since relatively few currents flow in a relatively small number of resistors for an eight-bit character from source 10, it has been found that resistors in the network 23' for the embodiment of FIG. 3 can be of the plus or minus 10-percent tolerance class for resistance values.

In terms of performance, the embodiment of FIG. 3 produces an analog signal with smaller signal step transitions, less signal transient overshoot, less noise, and more relaxed resistance tolerances. These benefits are obtained at the expense of an increased number of resistors and wires in resistor network 23' and associated with register 21'. However, only two different resistor values are required.

Figure 4:
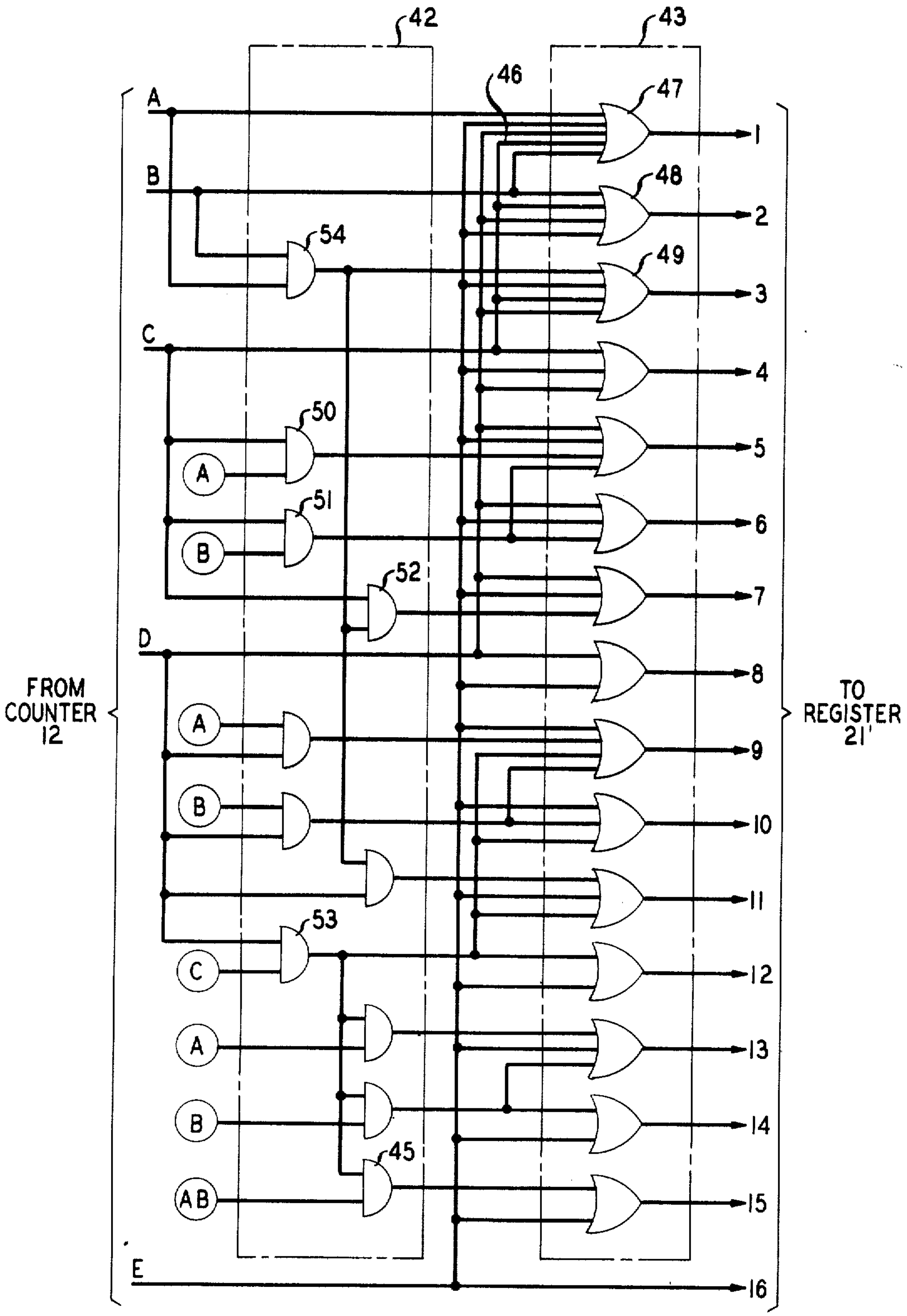
FIG. 4 is a schematic diagram of one form of code translator employed in FIG. 3.

In FIG. 4 is shown schematic detail of one possible embodiment for the translator 41 in FIG. 3. Five input leads A, B, C, D, and E couple signals to the translator from the counter 12. These signals are applied to a set 42 of logical AND, or coincidence, gates which in turn provide their outputs to input connections of a set 43 of logical OR gates. Some of the AND gates located adjacent to particular ones of the translator input leads in the drawing of FIG. 4 have input connections from input leads which are relatively remotely located with respect to those gates, and in these cases inputs from those remote leads are designated simply by a circled reference character corresponding to such remote input lead. Also, the lowermost (as shown in FIG. 4) gate 45 of the set 42 includes an input from the output of the uppermost gate 54 of the same set, and that input is designated by the circled reference character AB to indicate the nature of the output signal of that uppermost gate, namely, a logical ONE signal produced upon coincidence of logical ONE A and B translator inputs. In addition, certain of the OR gates in the set 43 include inputs directly from the translator inputs A through E. Similarly the outputs of the OR gates supply fifteen of the respective outputs of the translator 41 and the input E is directly coupled through the translator to provide the sixteenth output.

The nature of the interconnections in the translator 41 can be conveniently summarized. Thus, each translator input activates, either directly or through only an OR gate, a translator output corresponding to a decimal value which is equal to a 5-bit binary character in which that input contained the only binary ONE digit. In addition, each translator input is connected through gates of the OR gate set 43 to activate all translator outputs which are above (as illustrated in FIG. 4) the corresponding output that was actuated as just outlined. Each translator input is further utilized to enable AND gates in the set 42 and associated with translator inputs below (as illustrated in FIG. 4) the first-mentioned translator input, and which AND gates supply input connections to OR gates that determine signal levels on translator outputs at decimal values corresponding to other 5-bit binary signal expressions involving a logical ONE at such first-mentioned input connection.

For example, assume that only the C input is energized. That input signifies in binary terms the decimal valve 4. Accordingly, the C input is coupled through the OR gate set 43 to the translator output 4, and the C input is further connected by way of a lead 46 to inputs of OR gates 47, 48, and 49 which determine the signal level on translator outputs 1, 2, and 3, respectively. Finally, in the event that other translator inputs than the C input should be energized in binary characters also requiring a ONE at the C input, that same C input is also applied through AND gates 50, 51, 52, and 53 for possibly energizing translator outputs 5, 6, 7, and 12 through 15, respectively.

Figure 5:
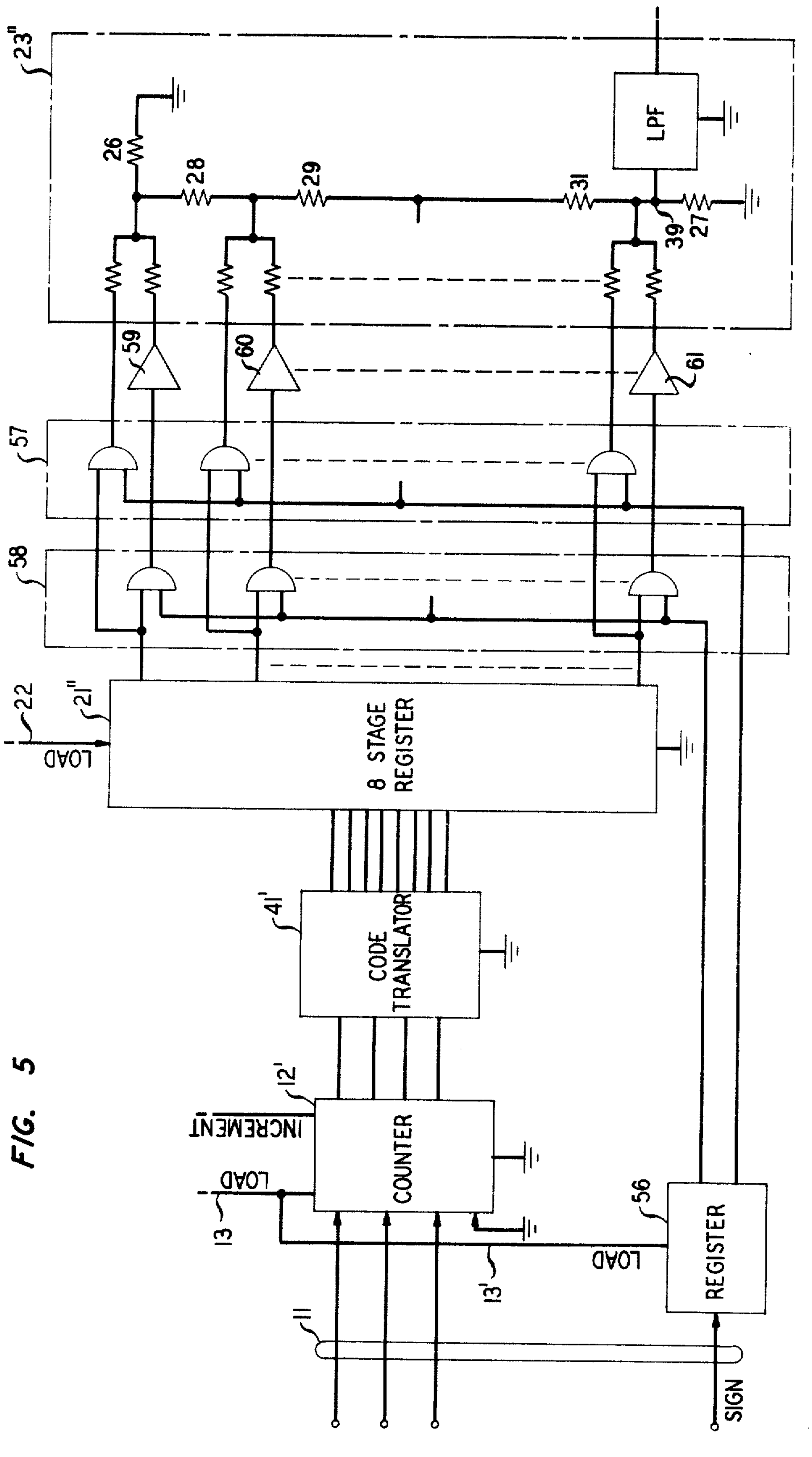
FIG. 5 is a partial schematic diagram showing a further modification of the converter of FIG. 1.

FIG. 5 depicts a further embodiment of the invention which is designed for digital-to-analog conversion of a segmented pulse code modulation, or logarithmically companded, signal. In this embodiment the most significant bit of the 8-bit binary coded word provide from signal source 10 in FIG. 10 is the sign bit, and that bit is coupled to control the signal state of a 1-bit register 56. The remaining three bits of the most significant bit group define various amplitude segments of logarithmically increasing size to cover the full range of analog amplitudes that are to be represented. These three bits are appplied to inputs of a counter 12' which in this embodiment has those inputs applied to the three least significant of four counter stages. Finally, the four bits of the least significant bit group define equally sized, amplitude intervals which are employed for subdividing the full range of each of the aforementioned amplitude segments. These least significant bits are applied to the counter 18 of FIG. 1 and utilized in the same manner described in connection with FIG. 1 for incrementing counter 12' once during each character time.

The four outputs of binary counter 12' are applied to a translator 41' which is of the same type illustrated in FIG. 4 but which now is provided with only four input connections and eight output connections. Thus, the translator 41' corresponds to the upper portion of FIG. 4 down through the input D and the output 8 and assuming that all circuits below the latter input and output are eliminated. Register 21'' has eight stages and is otherwise the same as the register 21 of FIG. 1. Resistor network 23'' is of the same type as the network 23 in FIG. 1; but since it receives n-out-of-m coded input signal characters, it produces an analog output with amplitudes that can vary over a corresponding logarithmically increasing range of amplitude segments. Network 23'' includes two sets of equal tap resistors for coupling outputs of register 21'' to taps on the series connection of the 500-ohm resistors 28 through 31. In this embodiment, however, the tap resistors are advantageously assigned resistances of 2 kilohms. Outputs of register 21'' are applied to respective tap resistors of one set in the network 23'' by way of a first set 57 of logical AND gates. Those same register outputs are further coupled to the other set of tap resistors in network 23'' by way of a second set 58 of AND gates. Each of the gates of the latter set is coupled to a corresponding one of the tap resistors in the second set of such resistors by way of a signal inverter, such as inverters 59, 60, and 61 which are specifically shown in the drawing.

The AND gates of the two sets 57 and 58 are further enabled by the complementary signal outputs of the 1-bit sign register 56. Thus, the outputs of register 21'' are applied directly through gate set 57 to resistor network 23'' for a sign bit indicating one polarity, but those same outputs are applied through gate set 58 and the inverters to the network 23'' in complemented form for a sign bit indicating the opposite polarity. In other words, if the output from a given stage of register 21'' contributes one unit of current to the network 23'' in response to one polarity of the sign bit, that same register output will contribute no current to the resistor network 23'' if the sign bit indicates the opposite polarity. Consequently, a bipolar binary coded input signal produces all corresponding amplitude steps in a unipolar analog output signal format. Two sets of tap resistors are employed in the illustrative embodiment of FIG. 5 to prevent interaction between outputs of inverters and AND gates serving the same tap.

Although the present invention has been described in connection with particular embodiments thereof, it is to be understood that additional modifications and embodiments which will be obvious to those skilled in the art are included within the spirit and scope of the invention.

What is claimed is:

1. In combination, means, responsive to a pulse coded digital character occurring in a character time interval of predetermined duration, for producing an output analog signal at a first amplitude representing the coded value of a first portion of said character, means for changing the amplitude of said analog signal to a second amplitude for a fraction of said time interval, and said changing means including means, responsive to a discrete second portion of said character, for fixing the magnitude of said fraction of said time to correspond to the coded value of said second part, the difference between said first and second amplitudes being independent of said coded values and being chosen so that the average analog amplitude over said character time corresponds to the value represented by said digital character.

2. The combination in accordance with claim 1 in which said changing means include means for disposing said second amplitude portion of said analog signal entirely in the final fraction of said time.

3. The combination in accordance with claim 1 in which said producing means includes means, responsive to a most significant bit group of said character, for determining said first level, and said changing means includes means, responsive to a least significant bit group of said character, for determining said fraction.

4. A digital-to-analog signal converter comprising means, responsive to a first pulse coded signal bit group of a digitally represented information value character, for determining in part the magnitude of an analog signal corresponding to said character, each bit position of the character representing an amplitude quantizing interval of different significance according to a predetermined pulse coding rule, and means, responsive to a second pulse coded signal bit group of said character, for increasing said analog signal at a time in the time interval of the character determined by the value represented by the second bit group, the amount by which said analog signal is so increased being independent of the value of either of said bit groups and being chosen so that the average analog amplitude over said character time corresponds to the value represented by said digital character.

5. A digital-to-analog signal converter comprising means, responsive to a first pulse coded signal bit group in each of plural digitally represented information value characters, for determining in part the magnitude of an analog signal corresponding to said character, each bit position of the character representing an amplitude quantizing interval of different significance according to a predetermined pulse coding rule, means responsive to a second pulse coded signal bit group of said character, for producing an output pulse at a time in the time interval of the character determined by the value represented by the second bit group, said first and second bit groups occupying different portions of the character, the definition of such portions being independent of the coded information content of the character, and means, in the determining means and responsive to said output pulse, for increasing said magnitude part by an amount equal to the value of a predetermined amplitude quantizing interval of said first bit group, the latter interval being chosen so that the average analog amplitude over said character time corresponds to the value represented by said digital character.

6. The converter in accordance with claim 5 in which said magnitude determining means comprises means for periodically sampling said first signal bit group of each character at a first determined rate, and means for converting signal bit group samples from said sampling means into an analog signal.

7. The converter in accordance with claim 5 in which said producing means comprises a counter including means for loading said counter with samples of said second bit group taken at the character occurrence rate, means for incrementing the contents of said counter at a rate sufficient to allow attainment of full count in said counter during one period of said smapling rate if said sample is an all-ZERO sample, and means, responsive to attainment of full count in said counting means, for producing said output pulse.

8. The converter in accordance with claim 7 in which said magnitude determining means comprises a register, means for counting pulses, means for incrementing said counting means in response to said output pulse, and means for periodcially coupling contents of said counting means to said register at a rate which is equal to said incrementing rate for the first-mentioned counter.

9. The converter in accordance with claim 8 in which there are provided an output terminal, and a resistor network connected for coupling outputs of respective stages of said register to said output terminal.

10. The converter in accordance with claim 9 in which said resistor network comprises a reference terminal, a load resistor connected between said output and reference terminals, a further resistor having a resistance approximately the same as the resistance of said load resistor and having one terminal connected to said reference terminal, a plurality of resistors each having substantially the same resistance, which latter resistance is approximately half the resistance of said load resistor, all resistors of said plurality being connected in series between said output terminal and a remaining terminal of said additional resistor, and a further plurality of resistors each having substantially the same resistance as said load resistor and each connected between a different stage output of said register and a different terminal of said series-connected resistors.

11. The converter in accordance with claim 10 in which a low-pass filter is coupled to receive signals from said output terminal, and said filter has a cut-off frequency lower in frequency than a half of said second bit group sampling rate.

12. The converter in accordance with claim 8 in which said register includes *m* stages, and said periodic coupling means comprises a code translator for converting said predetermined code of said first bit group into a n-out-of-m code wherein *n* represents an analog signal level corresponding to the value represented by said first bit group and indicates further the actuation of only the *n* least significant bit positions of said n-out-of-m code.

13. The converter in accordance with claim 12 in which a resistor network is included in said determining means and comprises an output terminal, a reference terminal, a load resistor connected between said output and said reference terminals, and a plurality of resistors, each having substantially the same resistance, such resistance being substantially larger than the resistance of said load resistor, and each resistor of said plurality being connected between said output terminal and a different stage output of said register.

14. The converter in accordance with claim 12 in which said determining means includes a resistance network comprising an output terminal, a reference terminal, a load resistor connected between said output and reference terminals, a further resistor having a resistance approximately the same as the resistance of said load resistor and having one terminal connected to said reference terminal, a plurality of resistors each having substantially the same resistance, which latter resistance is approximately half the resistance of said load resistor, all resistors of said plurality being connected in series between said output terminal and a remaining terminal of said additional resistor, and a further plurality of resistors each having substantially the same resistance as said load resistor and each connected between a different stage output of said register and a different terminal of said series-connected resistors.

15. The converter in accordance with claim 14 in which said predetermined code is a segmented pulse code in which the most significant bit of said first bit group indicates the sign of the signal represented thereby and other bits of the same group define one of a plurality of amplitude defining segments of increasing size, such other bits being applied to different stage inputs of said determining means counter, and said second bit group defines one of a plurality of equal amplitude intervals within one of said segments defined in said first bit group, the bits of said second bit group being applied to said producing means counter, a separate register is provided for receiving said most significant bit of said first bit group, two sets of selectively actuatable gates are coupled for applying outputs of said magnitude determining means register to said resistance network, inverting means couple one of said two sets of gates to said resistance network, and means are provided for enabling one or the other of said two sets of gates in accordance with the binary signal state of said separate register.

16. A digital-to-analog converter including a first circuit responsive to a first pulse coded signal bit group of a digitally represented information value character for determining in part the magnitude of a corresponding analog signal, each bit position of the character representing an amplitude quantizing interval of different significance according to a predetermined pulse coding rule, a second circuit responsive to a second bit group of the same character for determining in part the magnitude of the analog signal, and the converter being CHARACTERIZED IN THAT the first circuit produces a first analog signal magnitude corresponding to the value represented by the first bit group, and the second circuit includes a circuit for producing an output pulse at a selectable time in the time interval of the character, which selectable time is determined by the value represented by the second bit group, and the second circuit further includes a circuit for coupling the output pulse to the first circuit to increase the first analog signal magnitude by an amount equal to the value of a predetermined amplitude quantizing interval of the first bit group, the latter interval being chosen so that the average analog amplitude over said character time corresponds to the value represented by said digital character.

17. In combination, means, responsive to a pulse coded digital character occurring in a predetermined time interval, for producing an output analog signal at a first amplitude determined by a first portion of said character, means for stepping the amplitude of said analog signal to a different amplitude for a fraction of said time, and said stepping means including means, responsive to a second portion of said character, for fixing the magnitude of said fraction of said time during which said analog signal is at an amplitude step that is different from said first amplitude, said fraction corresponding in duration to the coded value of said second part, said different amplitude being chosen so that the average analog amplitude over said predetermined time corresponds to the value represented by said digital character.

18. In combination, means for separately storing first and second parts of pulse coded digital characters occurring at a predetermined character rate, means for changing the value of the stored first part of each character to another value at least at one selectable time during the character time, means, responsive to the value of said second part of such character, for fixing the fraction of said time during which said first part is at said other value, and means, recurrently operable at a rate which is substantially higher than said character rate, for deriving from said first part storing means an analog signal having an amplitude corresponding to the value of the contents of such storing means part, said other value being chosen so that the average analog amplitude over said character time corresponds to the value represented by said digital character.

* * * * *

UNITED STATES PATENT AND TRADEMARK OFFICE

CERTIFICATE OF CORRECTION

PATENT NO. : 3,893,102

DATED : July 1, 1975

INVENTOR(S) : James C. Candy

It is certified that error appears in the above-identified patent and that said Letters Patent are hereby corrected as shown below:

In the application, column 5, line 54, "comprise" should read --compromise--. Column 6, line 62, after "39' " insert a period. Column 8, line 10, "provide" should read --provided--. Column 10, claim 7, line 36, "smapling" should read --sampling--.

Signed and Sealed this

*twenty-fifth* Day of *November 1975*

[SEAL]

*Attest:*

RUTH C. MASON
*Attesting Officer*

C. MARSHALL DANN
*Commissioner of Patents and Trademarks*